(12) United States Patent
Suzuki et al.

(10) Patent No.: US 7,059,778 B2
(45) Date of Patent: Jun. 13, 2006

(54) OPTICAL FIBER BUNDLE, LIGHT SOURCE DEVICE USING THE OPTICAL FIBER BUNDLE, AND METHOD FOR MANUFACTURING THE LIGHT SOURCE DEVICE

(75) Inventors: Toshimi Suzuki, Kanagawa (JP);
Souichi Endo, Kanagawa (JP);
Yasuhiko Shishido, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 71 days.

(21) Appl. No.: 10/425,977

(22) Filed: Apr. 30, 2003

(65) Prior Publication Data

US 2004/0033037 A1 Feb. 19, 2004

(30) Foreign Application Priority Data

Apr. 30, 2002 (JP) ............................ P2002-129316

(51) Int. Cl.
*G02B 6/36* (2006.01)
(52) U.S. Cl. ............................ 385/53; 385/54; 385/901
(58) Field of Classification Search ................. 385/53, 385/115, 116, 901, 54
See application file for complete search history.

(56) References Cited

U.S. PATENT DOCUMENTS

| | | | | |
|---|---|---|---|---|
| 4,124,271 A | * | 11/1978 | Green | 385/21 |
| 4,932,747 A | * | 6/1990 | Russell et al. | 385/115 |
| 4,997,259 A | * | 3/1991 | Ichimura et al. | 385/115 |
| 5,104,608 A | * | 4/1992 | Pickering | 362/568 |
| 5,239,982 A | * | 8/1993 | Trauthen | 600/117 |
| 5,832,151 A | * | 11/1998 | Riser et al. | 385/31 |
| 5,857,041 A | * | 1/1999 | Riser et al. | 385/31 |
| 5,882,102 A | * | 3/1999 | Pileski | 362/554 |
| 5,887,102 A | * | 3/1999 | Mueller et al. | 385/115 |
| 6,078,713 A | | 6/2000 | Tausch et al. | |
| 6,332,092 B1 | * | 12/2001 | Deckert et al. | 600/476 |
| 6,487,440 B1 | * | 11/2002 | Deckert et al. | 600/476 |
| 6,504,984 B1 | * | 1/2003 | Wakeman et al. | 385/133 |
| 2004/0033037 A1 | * | 2/2004 | Suzuki et al. | 385/115 |

FOREIGN PATENT DOCUMENTS

| | | |
|---|---|---|
| JP | 55-26534 | 2/1980 |
| JP | 56-52711 | 5/1981 |
| JP | 63-221302 | 9/1988 |
| JP | 02-293633 | 12/1990 |
| JP | 10-206658 | 8/1998 |
| JP | 2001-313251 A | 11/2001 |

* cited by examiner

*Primary Examiner*—Brian M. Healy
(74) *Attorney, Agent, or Firm*—McDermott Will & Emery LLP (57) ABSTRACT

An optical fiber bundle includes a plurality of optical fibers bundled on an input terminal side and on an output terminal side. The optical fiber bundle receives light from the input terminal side, and outputs the light to the output terminal side. The optical fiber bundle has a feature in that the optical fiber are divided, on the input terminal side, individually or into a plurality of groups in accordance with output terminal side positions of the optical fiber. The optical fiber bundle is arranged to adjust input light for each of the optical fibers or for each of the groups.

11 Claims, 6 Drawing Sheets

INPUT TERMINAL SIDE

OUTPUT TERMINAL SIDE

LIGHT INTENSITY

Li = IRRADIATION DISTANCE
r = RADIUS OF IRRADIATION FACE

OPTICAL FIBER BUNDLE, LIGHT SOURCE DEVICE USING THE OPTICAL FIBER BUNDLE, AND METHOD FOR MANUFACTURING THE LIGHT SOURCE DEVICE

BACKGROUND OF THE INVENTION

1. Field of the Invention

The present invention relates to an optical fiber bundle, a light source device using the optical fiber bundle, and a method for manufacturing the light source device, and particularly relates to control of an output light intensity distribution of the optical fiber bundle in the light source device.

2. Description of the Related Art

Figure 11:
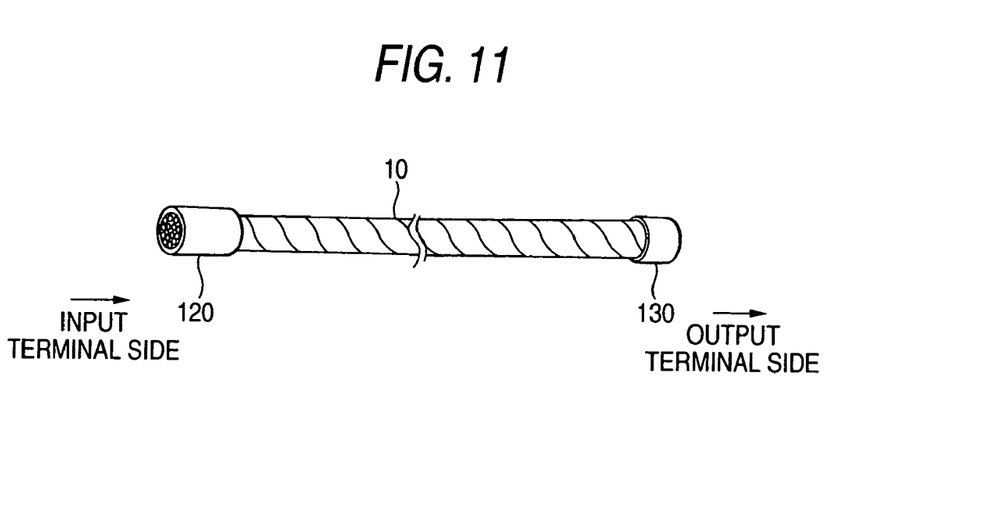
FIG. 11 is a view showing a optical fiber bundle in the related art.

An optical fiber bundle has several to several thousands of a bundled optical fiber. The bundle optical fiber are bonded and polished in terminal portions of the optical fiber bundle. The optical fiber bundle is used widely for lighting or energy transfer. As shown in FIG. 11, both end portions 120 and 130 of a tube 10 of a optical fiber bundle are typically fixed with sleeve-like metal fittings or the like, but flexibility is secured in the intermediate portion of the optical fiber bundle. Accordingly, the light input area or output area of the optical fiber bundle can be increased while the degree of spatial freedom thereof is secured. Accordingly, when the output area is made extremely small and an optical fiber light source is placed in a desired place, the optical fiber bundle can be installed in any place.

Thus, attempts in various fields are made to apply light source devices using optical fiber bundles to light sources for exposure in light steppers or light sources for curing photo-setting resin for use in bonding of optical components or the like.

In such circumstances, there is a request to make the output light intensity distribution uniform. In an optical fiber bundle shaped into a ring on its output side, there is another request to form the output light intensity distribution uniform concentrically and circumferentially.

In addition, when a light source device is used as a light source for exposure in a stepper, it is necessary to change the wavelength of exposure light in accordance with a resist or to adjust the irradiation energy. Thus, a different light source device is required whenever the occasion demands.

Further, a stepper needs a step of aligning a mask with a wafer prior to exposure, that is, a mask alignment step. A light source having a different wavelength from the sensible wavelength of a resist is required in the mask alignment step. Thus, two different light sources are required. Alternatively, there is indeed a method in which the light intensity of a light source for exposure is reduced on a large scale at the time of alignment so that the light source is used as a light source for alignment. However, there is a problem that it is inevitable to expose the resist to light at the time of alignment.

Moreover, it is desired to regulate an area to be irradiated at the time of alignment because it is not necessary to irradiate the wafer surface as a whole but it will go well if only an alignment mark provided in a dummy area such as a wafer circumferential edge portion is irradiated. However, existing light source devices cannot perform such area definition.

In addition, it is necessary to reduce the light intensity in the area corresponding to the circumferential edge portion. It is, however, difficult to reduce the light intensity only in the circumferential portion. When exposure is performed with a regular intensity distribution, overexposure occurs in the circumferential edge portion, resulting in fogging. Thus, there is a problem that a precise resist pattern cannot be obtained.

It is therefore necessary to allow latitude to the irradiation light intensity distribution. In a typical method, however, uniform irradiation with light on the wafer is fundamental, and it is difficult to change the intensity or change the irradiation wavelength for each area.

Furthermore, in recent years, with the development of digital cameras and the like, optical components are made finer and finer. When such optical components are mounted, there is an increasing request to make alignment and fixation more accurate. When optical components are fixed to each other by use of photo-setting resin, it may be desired to perform two-stage curing treatment using different kinds of resin. In such a case, two separate light sources having different emission wavelengths are required as light sources for the treatment. It is therefore difficult to put such a treatment to practical use.

For the request to make the light intensity uniform, in the related art, there is adopted a method in which optical fibers are randomized on the output side of the optical fiber bundle so that the light intensity distribution is adjusted. Optical fibers having a high light intensity are mixed with fibers having a low light intensity appropriately uniformly so that a desired uniform output light intensity distribution can be obtained.

In such a method, the optical fibers are randomized in the optical fiber bundle, and then the output light intensity of the optical fiber bundle is confirmed. If the output light intensity is not uniform as a result of the confirmation, the optical fibers are randomized so that the output light intensity is uniform. Therefore, the yield of the optical fiber bundle and the efficiency of manufacturing are limited by this randomized method.

In addition, an area where the output light is irradiated from the optical fiber bundle cannot be defined or changed in this method.

Figure 12:
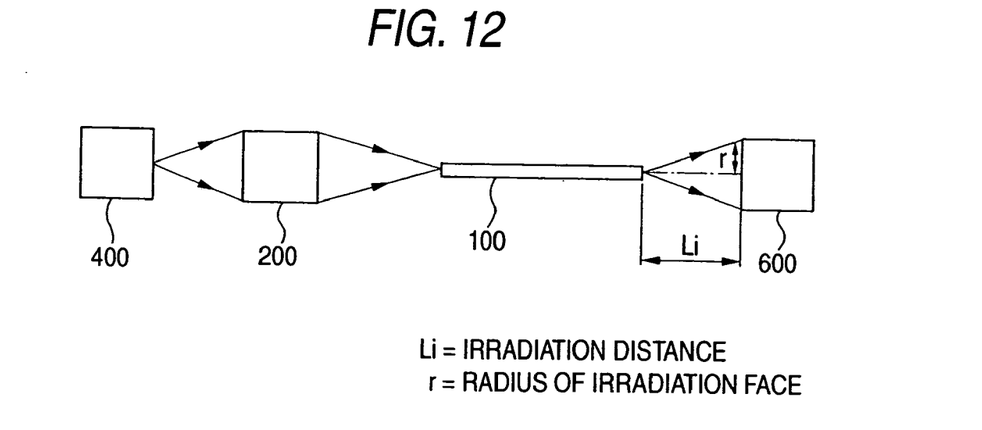
FIG. 12 is a view showing an example of how to use the optical fiber bundle in the related art.

Further, when the output light intensity is precisely control by using the optical fiber bundle, illuminance near an output terminal of the optical fiber bundle has to be measured by an illumination sensor 600 and fed back to a light source as shown in FIG. 12. However, this results in a problem that the device becomes large in size. In addition, an optical system 200 also becomes a major factor in obstruction to the miniaturization of the device.

Furthermore, even if the light intensity distribution can be controlled with a large-sized device, the wavelength cannot be adjusted by use of the optical fiber bundle in the same light source device.

It is therefore necessary to provide a light source for alignment and a light source for exposure separately.

SUMMARY OF THE INVENTION

It is an object of the invention to provide an optical fiber bundle which can control the output light intensity distribution efficiently, and a light source device and a manufacturing method using the optical fiber bundle.

It is another object of the invention to provide an optical fiber bundle in which the output light intensity can be controlled precisely, and a light source device using the optical fiber bundle.

It is another object of the invention to provide an optical fiber bundle in which the output light intensity distribution can be varied, and a light source device using the optical fiber bundle.

It is another object of the invention to provide an optical fiber bundle in which the output light wavelength can be varied, and a light source device using the optical fiber bundle.

It is further another object of the invention to provide a method for manufacturing an optical fiber bundle which can be manufactured easily.

Therefore, according to the invention, there is provided with an optical fiber bundle, comprising: a plurality of optical fibers bundled on both an input terminal side thereof and an output terminal side thereof, the optical fibers receiving light from the input terminal side and outputting the light to the output terminal side; and a connecting member provided for the optical fiber bundle; wherein the optical fibers are divided on the input terminal side, individually or into a plurality of groups in accordance with output terminal side positions of the optical fibers, and the optical fiber bundle is arranged to adjust the light received from the input terminal side for each of the optical fibers or for each of the groups.

With such a configuration, it will go will if input light is adjusted without adjustment of alignment of the optical fiber bundle itself. Accordingly, the light intensity or the waveform can be controlled efficiently and precisely. A desired output pattern can be obtained by the adjustment of the light received from the input terminal side.

It is preferable that each of the optical fibers includes a connecting member. Thus, it becomes easy to change over a light source for the optical fibers and it becomes possible to adjust the light intensity distribution precisely.

It is preferable that the optical fibers are divided into a plurality of groups in accordance with output terminal side positions thereof, and that each of the groups includes a connecting member. Thus, the light source for the optical fibers can be adjusted for each group so that a desired light intensity distribution can be obtained efficiently.

In addition, when a light intensity adjusting member is provided for each of the optical fibers or each of the groups, a precise light intensity distribution can be obtained. Further, when a light intensity adjusting member such as a diaphragm is provided, the light intensity can be adjusted for each optical fiber or for each group even if the light comes from a single light source.

In addition, when the optical fibers are designed to be able to be connected directly to an optical fiber light source for each of the optical fibers or for each group, it is not necessary to provide any connecting members. Thus, extremely precise control can be attained. In addition, the light intensity or the emission wavelength can be controlled independently so that light with a desired light intensity distribution and with a desired emission wavelength can be obtained easily.

It is also preferable that the optical fiber bundle includes optical fibers for detecting output light on the output terminal side of the optical fiber bundle. The optical fibers do not have to be designed specially. The optical fibers may be connected not to a light source but to light-sensitive detector on their input terminal side. When a current flowing in accordance with the received light intensity is measured with each light-sensitive detector, the light intensity can be detected easily. Then, the light intensity of the optical fiber light source to be connected to the optical fiber whose output terminal is disposed near the sensing position of the light-sensitive detector is adjusted in accordance with the output of the light-sensitive detector. In such a manner, precise control can be attained easily.

It is also preferable that the optical fibers are divided into a plurality of groups in accordance with their output terminal side positions, and an optical fiber for sensing is included in each group for detecting output light therefrom.

When input light can be adjusted on the input terminal side on the basis of the outputs of the light-sensitive detectors, it is possible to obtain a light intensity distribution adjusted precisely.

It is desired that the optical fibers are aligned on their output terminal side in an angular shape, a ring shape, or a round shape. According to the invention, a desired light pattern can be obtained easily within the alignment.

It is also desired that the terminal surface positions of the optical fibers on the output terminal side are designed to be able to be adjusted relatively to one another so that the output pattern can be changed. In this case, adjustment can be made based on the output terminal side positions so that the degree of freedom can be secured for the adjustment.

In addition, each of the optical fibers may be made to have a diameter equal to the clad diameter of an optical fiber for communications. In this case, the transmission loss in the connection portion can be reduced easily.

Further, each of the optical fibers may include a buffer fiber portion on the input terminal side, the buffer fiber portion being designed to have a clad diameter varied in a plurality of steps. In this case, the transmission loss in the connection portion can be reduced easily.

It is preferable that multi-mode fibers are used as the optical fibers. In this case, it is possible to transmit more power.

It is preferable that single-mode fibers are used as the optical fibers. In this case, the cost is reduced, and the optical fiber bundle can be applied to power transmission sufficiently.

Further, the optical fibers may be arranged optical fibers made of single-mode fibers for sensing and optical fibers made of multi-mode fibers for outputting. In this case, it is possible to obtain an optical fiber bundle low in price and high in reliability.

When the optical fibers are divided into a plurality of groups on their output terminal side, one light source can be used for exposure in a plurality of steppers. Thus, it is possible to obtain a light source device small in size and low in cost.

There is provided with a light source device according to the invention comprising: an optical fiber light source; and an optical fiber bundle for receiving light from the optical fiber light source on an input terminal side thereof and outputting the light to an output terminal side thereof, the optical fiber bundle including a plurality of optical fibers bundled in a desired shape on both the input terminal side thereof and the output terminal side thereof, wherein the optical fibers are divided on the input terminal side thereof, individually or into a plurality of groups in accordance with output terminal side positions of the optical fibers, and the optical fiber bundle is arranged to adjust the light received from the optical fiber light source on the input terminal side for each of the optical fibers or for each of the groups.

It is preferable that each of the optical fibers includes a connecting member, and that each of the optical fibers is connected to the optical fiber light source through the connecting member.

It is preferable that the optical fibers are divided into a plurality of groups in accordance with output terminal side positions thereof, and that each of the groups includes a connecting member and is connected to the optical fiber light source through the connecting member.

It is preferable that the optical fibers are connected to the optical fiber light source through a light intensity adjusting member provided for each of the optical fibers or each of the groups Preferably, the optical fibers may be connected directly to the optical fiber light source individually or for each group. In this case, it is not necessary to provide any connecting members. Thus, the light intensity distribution can be adjusted easily by adjustment of a current supplied from a connected power supply, so that a desired light intensity distribution can be obtained easily in the output terminal.

Preferably, the optical fiber light source is formed, as a light source comprised of individual light sources provided for the optical fibers respectively. In this case, the light sources can be controlled independently of one another easily, so that the light intensity distribution can be adjusted precisely and easily.

Preferably, the optical fiber light source is formed to include a plurality of light source, which can be changed over from one to another. In this case, also when the optical fiber light source is used as a light source at another wavelength, the wavelength or the light intensity can be changed easily only by selection of one of the light sources. For example, instead of a light source for alignment and a light source for exposure provided separately, a selected light source can be used as both the light sources by the light source device using the optical fiber bundle. Thus, it is possible to provide a light source device small in size and capable of precise light control.

In addition, it is preferable that the light distribution pattern on the output terminal is varied in accordance with the light source selected from the plurality of light sources. In this case, the distribution pattern can be changed easily.

Preferably, a light emitting diode (LED) may be used as the optical fiber light source.

Alternatively, a laser diode (LD) may be used as the optical fiber light source. In this case, it is possible to obtain light energy having an accurate and sharp waveform due to straightness of laser light. Thus, exposure with high resolution can be attained.

Preferably, the optical fiber bundle may include at least one light-sensitive detector on the input terminal side where the optical fiber light source is disposed, so that the light-sensitive detector can be connected to the input terminal side of the optical fibers. Thus, it is possible to detect light easily.

It is more preferable that the optical fibers are divided into a plurality of groups in accordance with their output terminal side positions and an optical fiber for sensing is included in each group for detecting output light therefrom so that the optical fiber can be connected to a light-sensitive detector. In this case, the output distribution on the output terminal side can be detected by use of the fibers in the optical fiber bundle without using any other sensor. Accordingly, it is possible to obtain a light source device small in size and capable of precise optical control.

In addition, when one light-sensitive detector is connected to each sensing optical fiber on the input terminal side, the light intensity can be detected easily.

In addition, when input light can be adjusted on the input terminal side on the basis of the output of the light-sensitive detector, feed back control can be attained easily. Accordingly, it is possible to perform light control at all times so that it is possible to attain light control high in accuracy and high in reliability.

In addition, it is more preferable that a feedback control unit is provided for feedback control of a current supplied to the optical fiber light source based on the output of the light-sensitive detector.

Further, when on/off control of the optical fiber light source is allowed so that the irradiated area can be changed on the output terminal side of the optical fibers, the irradiation pattern can be adjusted easily. For example, when optical components are bonded by photo-setting resin cured due to two-step light irradiation, the light irradiation can be adjusted easily so that the irradiation peak is changed to another place.

It is also preferable that the irradiated area is formed into an angular pattern, a ring-like pattern or a round pattern.

In addition, the terminal surface positions of the optical fibers on their output terminal side maybe allowed to be adjusted relatively to one another so that the outgoing pattern can be changed. This affords the degree of freedom to the adjustment so that the adjustment can be carried out easily.

It is preferable that each of the optical fibers has a diameter equal to the clad diameter of an optical fiber for communications.

Further, each of the optical fibers may include a buffer fiber portion on the input terminal side, the buffer fiber portion being designed to have a clad diameter varied in a plurality of steps.

Multi-mode fibers may be used as the optical fibers in the light source device.

Single-mode fibers may be used as the optical fibers.

Further, the optical fibers maybe arranged out of sensing optical fibers made of single-mode fibers and output optical fibers made of multi-mode fibers.

In addition, when the optical fibers are divided into a plurality of groups on their output terminal side so that light energy can be supplied to a plurality of aligners, it is possible to provide small-size aligners each occupying a small area.

It is preferable that the optical fiber light source includes a light source for alignment and a light source for exposure, which are formed to be changed over so that mask alignment light and exposure light can be radiated from the output terminal of the same optical fiber bundle. In such a manner, exposure can be carried out easily without using another light source for alignment. In addition, light sources in different wavelength ranges may be used as the light source for alignment and the light source for exposure so that light whose wavelength is not in the exposure wavelength range of a resist can be emitted in the area corresponding to the wafer circumferential portion to which an alignment mark belongs, while light at the exposure wavelength can be emitted in the actual exposure area. In this case, desired exposure can be carried out easily.

It is preferable that the light intensity of the light source for alignment is made different from that of the light source for exposure, and a light source having a light intensity small enough not to crosslink the resist is used as the light source for alignment.

Preferably, the optical fiber light source includes a first light source and a second light source, which are formed to be able to be changed over from one to the other, and the irradiation light intensity can be adjusted on the output terminal side. In such a manner, a plurality of kinds of desired light sources can be obtained by only one optical fiber bundle.

It is also preferable that the optical fiber light source includes a first light source and a second light source, which are formed to be able to be changed over from one to the other, and the irradiation light wavelength can be adjusted on the output terminal side. In such a manner, a plurality of kinds of desired light sources can be obtained by only one optical fiber bundle.

There is provided with a method of manufacturing a light source device according to the invention, comprising the steps of: bundling a plurality of optical fibers to form an optical fiber bundle; irradiating a light from an input terminal side of the optical fiber bundle; detecting a light intensity and light distribution pattern on an output terminal side of the optical fiber bundle; calculating a light intensity of an optical fiber light source for each of the optical fiber on the basis of a detection result in order to obtain a desired output on the output terminal side; and connecting the optical fiber light source to the optical fiber bundle on the basis of a calculation result.

With such a configuration, the light intensity distribution on the output side can be controlled easily. In addition, it is not necessary to detect light in the step of bundling fibers to be bundled, but it will go well only if the optical fiber light source is adjusted after the optical fiber bundle is formed. It is therefore possible to form an optical fiber bundle high in reliability.

Preferably, the method has a feature to include the steps of: bundling a plurality of optical fibers to thereby form a optical fiber bundle; connecting an optical fiber light source to the input terminal side of the optical fiber bundle, and irradiating the optical fiber bundle with light; dividing the optical fibers into a plurality of groups in accordance with light intensity on the output side; and adjusting the optical fiber light source in accordance with light intensity for each divided group of the optical fibers to thereby control the light intensity distribution on the output side.

With such a configuration, it is possible to control the light intensity distribution on the output side easily.

Preferably, the control step may include the step of adjusting the optical fiber light source so that the light intensity distribution on the output side has a peak in its central portion. In this case, the control becomes easy. In addition, the optical fiber bundle configured thus has a feature to converge light easily.

Preferably, the control step may include the step of adjusting the optical fiber light source so that the light intensity distribution on the output side has a peak in its circumferential portion. In this case, the control can be made easy.

Preferably, the control step may include the step of adjusting the optical fiber light source to adjust the light intensity distribution on the output side becomes uniform. The optical fiber bundle configured thus is effective particularly in irradiating a wide area uniformly, for example, in curing ultraviolet-curing resin.

Preferably, the control step may include the step of adjusting the optical fiber light source so that the light intensity distribution on the output side is shaped into a ring. In such a manner, the light intensity distribution on the output side can be controlled to have a ring shape easily.

Preferably, the control step may include the step of adjusting the optical fiber light source so that the light intensity distribution on the output side has a peak in the central portion of the ring. In such a manner, the light intensity distribution on the output side can be controlled to have a peak in the central portion of the ring.

Preferably, the control step may include the step of adjusting the optical fiber light source so that the light intensity distribution on the output side has a peak in each of the inner circumferential portion and the outer circumferential portion of the ring. In such a manner, the light intensity distribution on the output side can be controlled to have a peak in each of the inner circumferential portion and the outer circumferential portion of the ring.

Preferably, the control step may include the step of adjusting the optical fiber light source so that the light intensity distribution on the output side becomes uniform in the ring portion. In such a manner, the light intensity distribution on the output side can be controlled to be uniform in the ring portion.

DESCRIPTION OF THE PREFERRED EMBODIMENTS

Embodiments of the invention will be described below in detail with reference to the drawings.

First Embodiment

Figure 1:
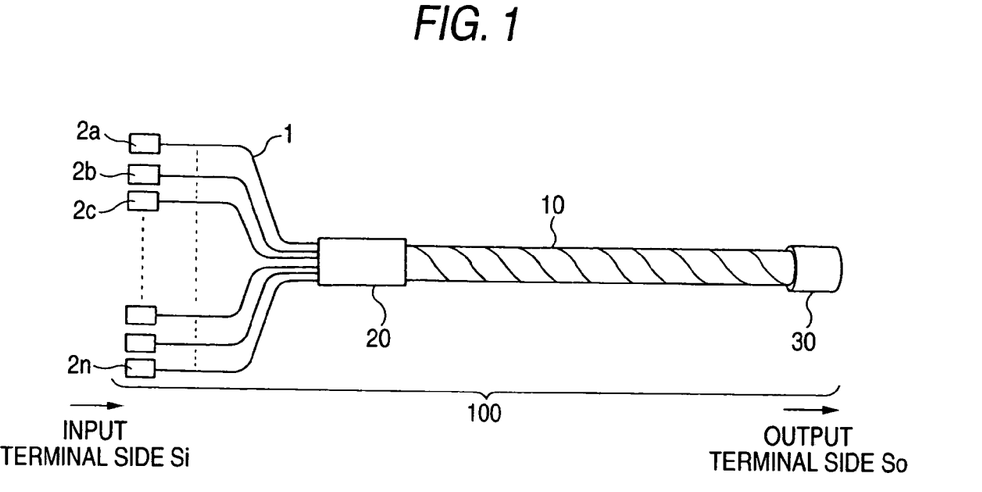
FIG. 1 is an explanatory view showing an optical fiber bundle according to a first embodiment of the invention.
Figure 2:
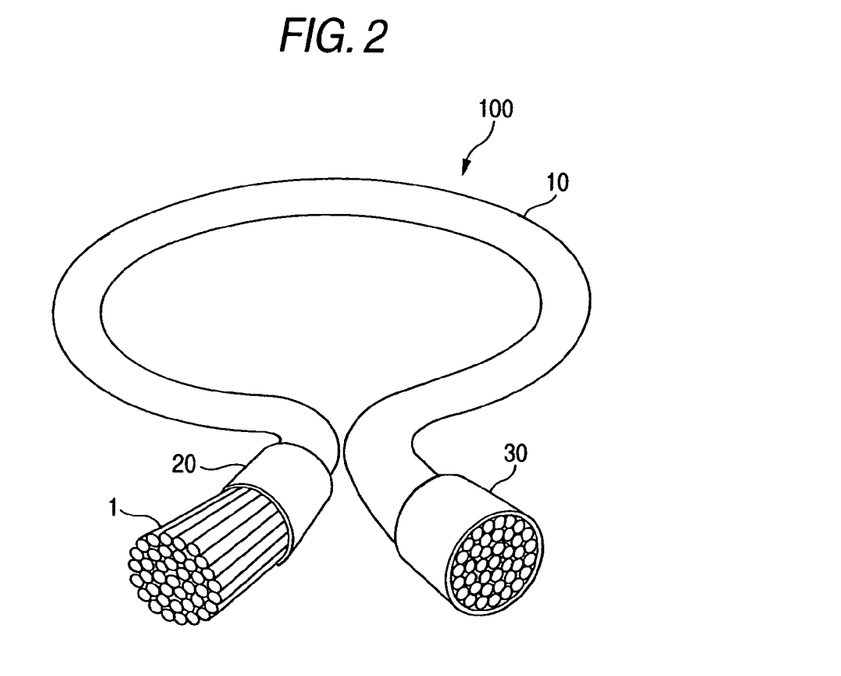
FIG. 2 is a view showing the optical fiber bundle according to the first embodiment of the invention.

An optical fiber bundle according to a first embodiment of the invention is an optical fiber bundle 100 including 25 optical fibers 1 bundled on an input terminal side Si and on an output terminal side So as shown in its conceptual diagrams of FIGS. 1 and 2. The optical fiber bundle 100 is designed to receive light from the input terminal side Si and outputs the light to the output terminal side. The optical fiber bundle 100 has a feature in that the optical fibers 1 are divided, on the input terminal side Si, individually or into a plurality of groups in accordance with their positions on the output terminal side So that input light can be adjusted for each optical fiber or for each group.

Figure 3A:
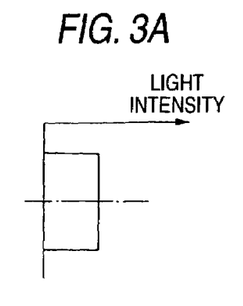
FIGS. 3A to 3C are graphs showing light intensity distributions obtained by the optical fiber bundle according to the first embodiment of the invention.
Figure 3B:
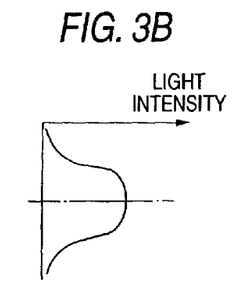
Figure 3C:
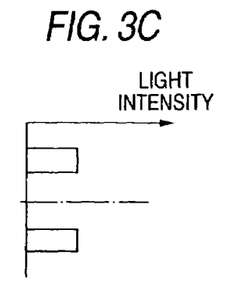

A cap 30 is attached to the output terminal side so as to expose the optical fiber ends to the outside. The cap 30 has a function of connecting member. Each of the optical fiber ends has a mirror-finished end face. On the other hand, on the input terminal side, the optical fiber 1 are bundled by a fiber collector 20, intertwined, and covered with a casing. In addition, connecting members $2a, 2b, 2c \ldots 2n$ are attached to the forward ends of the optical fiber individually on the input terminal side. The optical fiber bundle 100 has a feature in that by adjusting the light intensity distribution on the input terminal side Si, light with a desired light intensity can be supplied to each optical fiber of the optical fiber bundle 100 through the optical connecting members 2a, 2b, 2c, . . . , 2n connected to the optical fiber, for example, so that the light intensity distribution in the forward end of the cap 30 on the output terminal side has a peak in its central portion as shown in FIGS. 3A to 3C.

In such a configuration, each optical fiber is optically connected to a light source of a laser diode through a not-shown light intensity adjusting member so that a desired light intensity distribution can be obtained. In FIG. 3A, the light intensity distribution is formed as a rectangular pattern such that a pattern eligible as a light source for exposure can be obtained. When the laser diode used as the light source is replaced by another one with different properties or a current to be applied thereto is adjusted, the light intensity distribution can be formed easily as a normal distribution as shown in FIG. 3B or as a doughnut-shaped distribution in which only the contour is shining as shown in FIG. 3C.

Incidentally, the fiber diameter of the optical fiber may differ from that of the light source to be connected thereto. In such a case, the transmission loss in the connection portion can be reduced easily if each optical fiber includes a buffer fiber portion arranged so that the clad diameter varies in a plurality of steps on its input terminal side.

The following steps are used for manufacturing the optical fiber bundle.

First, a plurality of optical fibers 1 is bundled. A connecting member 2 is attached to each optical fiber on its input terminal side, while the end face on the output terminal side is machined, and then, the pipe sleeve 30 is attached thereto. A metal sleeve may be used instead of the pipe sleeve 30. Alternatively, after a connecting member is attached to each optical fiber, the output terminal side thereof may be mounted.

After that, each optical fiber 1 of the optical fiber bundle 100 is irradiated with light from the input terminal side, and the light intensity and the position on the output terminal surface are detected on the output terminal side.

Then, on the basis of this detection result, the light intensity of the optical fiber light source is calculated for each optical fiber so that a desired output can be obtained on the output terminal side.

On the basis of the calculation result in this calculation step, an optical fiber light source of a laser diode having desired properties is connected.

In such a manner, according to the method of the invention, it is possible to control the light intensity distribution on the output side easily and precisely. In addition, it is not necessary to carry out light detection in the step of bundling the fibers into an optical fiber bundle, but the optical fiber light source may be adjusted after the optical fiber bundle is formed. It is therefore easy to manufacture the optical fiber bundle. In addition, it is possible to form the optical fiber bundle high in reliability.

Second Embodiment

Next, a second embodiment of the invention will be described.

Figure 4:
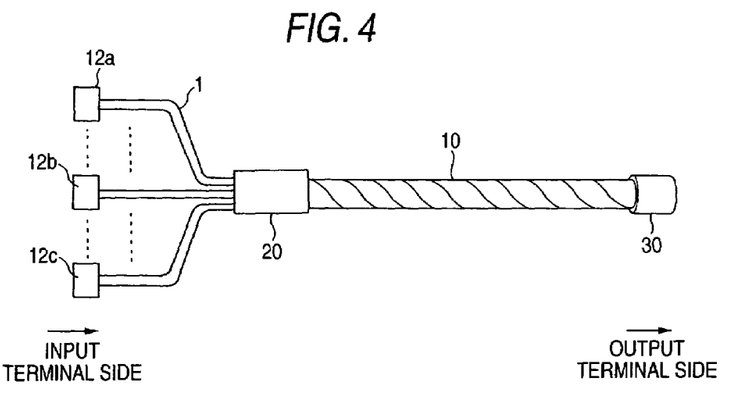
FIG. 4 is a view showing an optical fiber bundle according to a second embodiment of the invention.

Although the connecting members 2a, 2b, 2c, . . . , 2n were attached to the optical fiber individually in the optical fiber bundle according to the first embodiment, the second embodiment has a feature in that optical fiber are paired, and connecting members 12a, 12b, . . . , 12n are connected to the pairs respectively as shown in FIG. 4. The other portions are formed in the same manner as those in the first embodiment.

In such a manner, connection on the input terminal side becomes easier so that manufacturing becomes easier, and control also becomes easier. While manufacturing becomes easier, the accuracy is a little inferior to that in the first embodiment.

Third Embodiment

Next, a third embodiment of the invention will be described.

In this embodiment, description will be made on a light source device using the optical fiber bundle according to the first embodiment.

Figure 5:
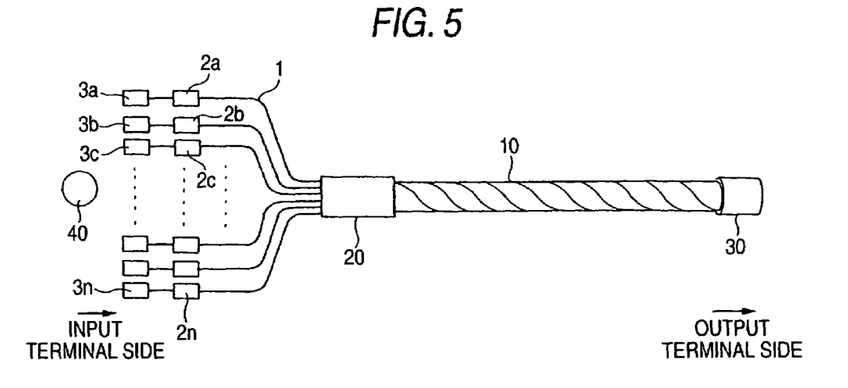
FIG. 5 is a view showing an optical fiber bundle according to a third embodiment of the invention.

This light source device has a feature in that light intensity adjusting members 3a, 3b, 3c, . . . , 3n are connected to connecting members 2a, 2b, 2c, . . . , 2n attached to optical fiber individually so that light from a white lamp light source 40 can be adjusted to have a desired light intensity by the light intensity adjusting members 3. The other portions are formed in the same manner as those in the first embodiment.

In such a manner, connection on the input terminal side becomes easier so that manufacturing becomes easier, and it is possible to obtain a light source device having a light intensity adjusted precisely.

Fourth Embodiment

Next, a fourth embodiment of the invention will be described.

Figure 6:
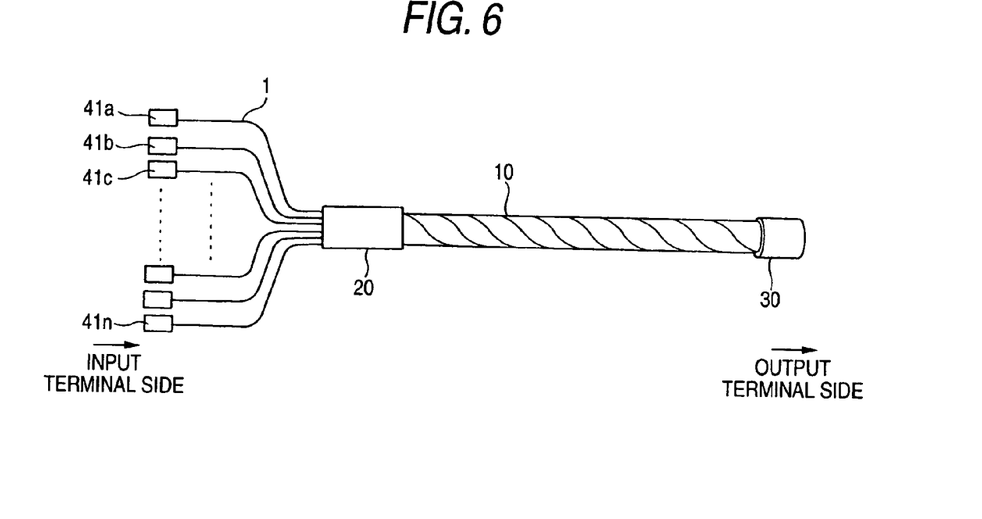
FIG. 6 is an explanatory view showing a light source device according to a fourth embodiment of the invention.

Although a single white light source was used in the third embodiment, the fourth embodiment has a feature in that laser diodes 41a, 41b, 41c, . . . , 41n are attached directly to optical fiber individually as shown in FIG. 6.

The other portions are formed in the same manner as those in the first embodiment.

Before manufacturing of the light source device, the properties of each optical fiber are measured in advance. On the basis of the measurement result, specifications for laser diodes are calculated individually for the optical fiber so that a desired light intensity distribution can be obtained. Then, the laser diodes are attached to the optical fiber.

In such a manner, it is possible to obtain a light source for exposure, which has an extremely sharp and precise light distribution.

Fifth Embodiment

Next, a fifth embodiment of the invention will be described.

Figure 7:
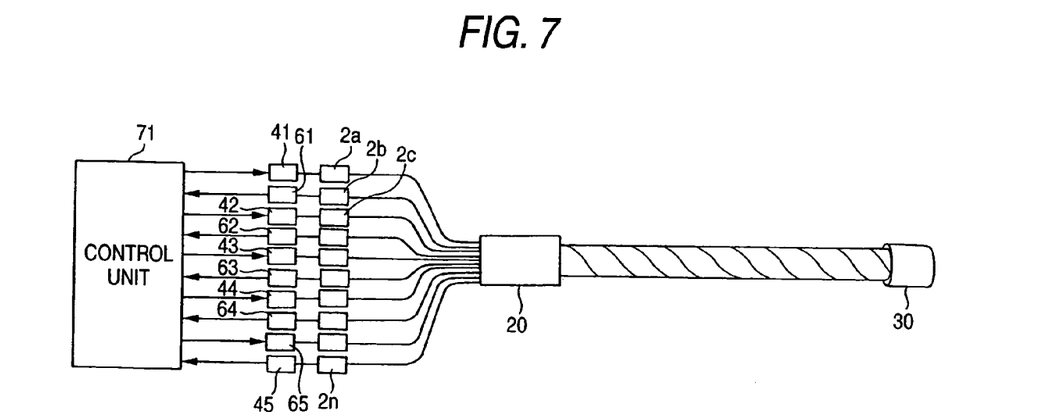
FIG. 7 is a view showing a light source device according to a fifth embodiment of the invention.

This embodiment has features as follows. That is, five optical fibers are used as sensing optical fiber. Light-sensitive detectors 61 to 65 are connected to input terminal-side connecting members of the five sensing optical fibers individually. On the basis of the outputs of the light-sensitive detectors 61 to 65, a control unit 71 calculates the light intensity to be supplied to groups of optical fibers having their output terminals in the light-sensitive detection areas of the light-sensitive detectors 61 to 65 respectively. Thus, currents to be supplied to laser diodes 41 to 45 connected to connecting members 2a, 2b, 2c, . . . , 2n are adjusted individually so that a desired light intensity distribution can be obtained.

Figure 8A:
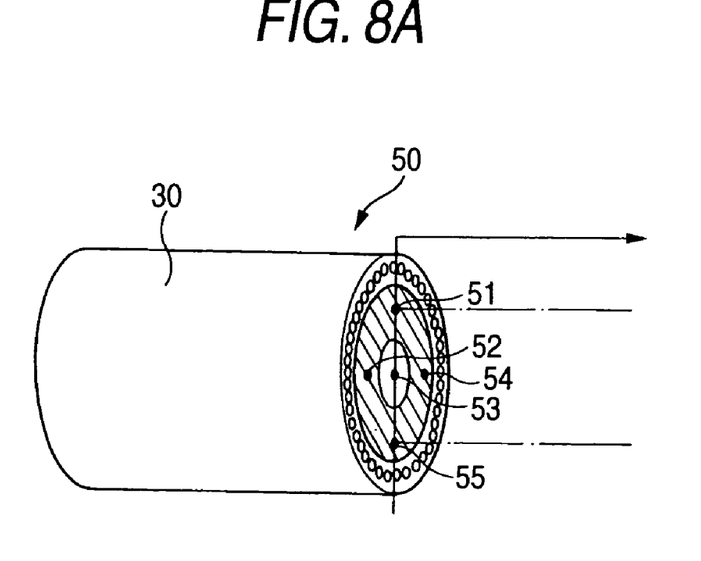
FIGS. 8A and 8B are a view and a graph showing the output terminal of a light source device according to a fifth embodiment of the invention.
Figure 8B:
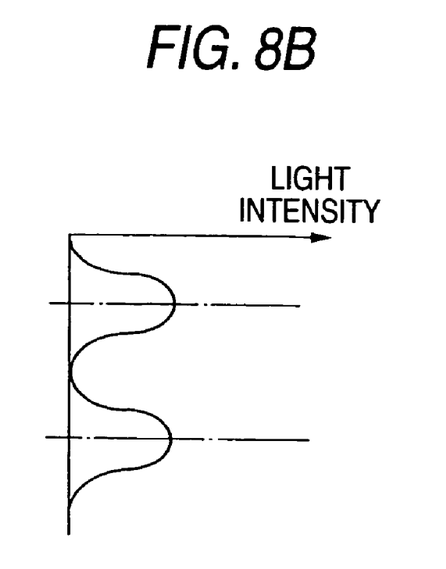

Incidentally, FIG. 8A shows a main portion enlarged view of the output terminal side of this optical fiber bundle. As is apparent from FIG. 8A, the optical fiber 1 connected to the light-sensitive detectors 61 to 65 respectively have output terminals 51 to 55 respectively. The currents to be supplied to the optical fiber having their output terminals in the respective areas are adjusted individually so that the light intensity distribution over those areas including the output terminals 51 to 55 is formed into a doughnut-like shape, as shown in FIG. 8B.

In addition, also in use, the input light may be adjusted on the input terminal side on the basis of the outputs of the light-sensitive detectors 61 to 65. In such a manner, feedback control can be carried out easily, and light control can be always carried out. Thus, high-accuracy and high-reliability light control can be attained.

Incidentally, a micro rod lens may be formed integrally with the output terminal side of each of the optical fiber connected to the light-sensitive detectors 61 to 65. In this case, the light convergence efficiency can be enhanced so that the light intensity can be detected precisely. In addition, alens system maybe also attached to each of the light-sensitive detectors. It is also effective to form the lens system integrally therewith.

In addition, this feedback control is not limited to a light source device using sensing fibers, but another sensor may be provided for the output terminal so that a light source can be controlled on the basis of the detection result obtained by sensing of the sensor. In such a manner, all the optical fiber constituting the optical fiber bundle can be used for light transmission.

Sixth Embodiment

Next, a sixth embodiment of the invention will be described.

In the second embodiment, the light intensity adjusting members 3a, 3b, . . . , 3n were connected to the connecting members 2a1, 2a2, 2b1, 2b2, . . . , 2n1, 2n2 attached to the optical fiber individually so that the light from the white lamp light source 40 can be adjusted to have a desired light intensity by the light intensity adjusting members 3a, 3b, . . . , 3n. However, the sixth embodiment has a feature in that optical fiber are divided into groups each containing seven optical fiber, and light intensity adjusting members 3a, 3b, . . . , 3n are connected to the groups individually.

Figure 9:
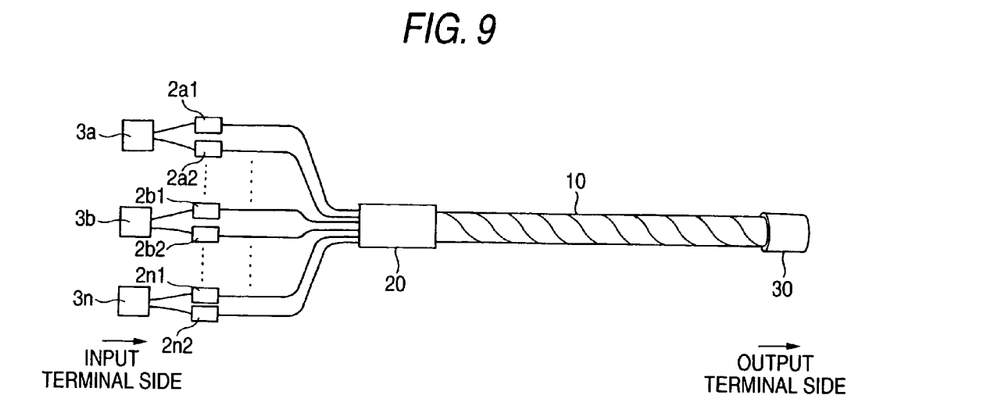
FIG. 9 is an explanatory view showing a light source device according to a sixth embodiment of the invention.

This light source device has a feature in that the light intensity adjusting members 3a, 3b, . . . , 3n are connected to individual groups (each containing seven connecting members) of the connecting members 2a1, 2a2, 2b1, 2b2, . . . , 2n1, 2n2 attached to the optical fiber individually so that light from a white lamp light source 40 can be adjusted to have a desired light intensity by the light intensity adjusting members 3, as shown in FIG. 9. The other portions are formed in the same manner as those in the second embodiment.

In such a manner, connection on the input terminal side becomes easier so that manufacturing becomes easier, and it is possible to obtain a light source device having a light intensity adjusted precisely.

Seventh Embodiment

Next, a seventh embodiment of the invention will be described.

Figure 10:
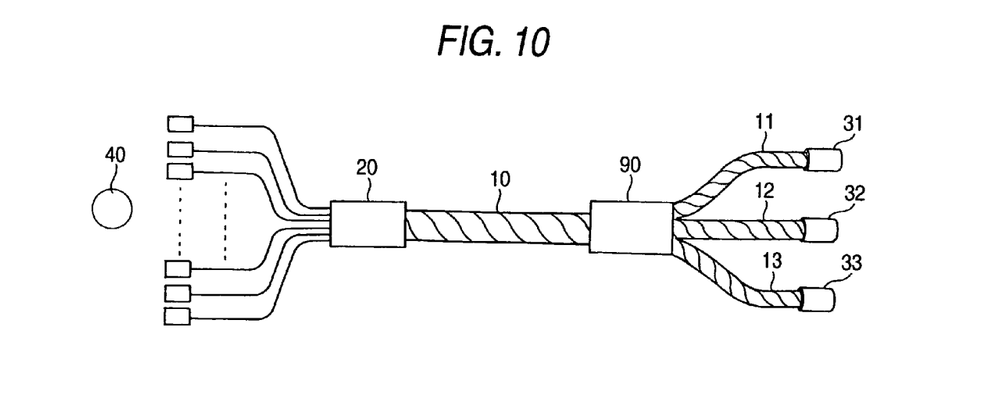
FIG. 10 is a view showing a light source device according to a seventh embodiment of the invention.

According to this embodiment, the output terminal side of the optical fiber bundle in the first embodiment is branched into three branch optical fiber bundle portions 11, 12 and 13 through a branch connecting member 90, and caps 31, 32 and 33 are attached to the output terminals of the branch optical fiber bundle portions respectively.

Thus, light energy can be transported through the branch optical fiber bundle portions 11, 12 and 13 by one light source device so that three exposure light sources for steppers can be constructed.

Eighth Embodiment

Next, an eighth embodiment of the invention will be described.

In the method for manufacturing an optical fiber bundle according to the first embodiment, a cap was attached to an optical fiber bundle formed directly, and the light intensity was then detected for adjustment. However, according to the eighth embodiment, the light intensity may be controlled after input terminals of fibers to be bundled and output terminals corresponding thereto are aligned and associated with each other in advance.

That is, an optical fiber bundle for use in this light source device is first formed.

On the occasion of manufacturing the optical fiber bundle, a large number of optical fiber are bundled on the input terminal side, and irradiated, on the input terminal side, with light from a light source. The optical fibers are divided into a plurality of groups on the basis of the magnitude of light intensity on the output side. The optical fibers divided into groups are realigned on the basis of the magnitude of light intensity so that the output-side light intensity distribution has a peak in its central portion. The optical fibers are bundled on the output terminal side, and a metal sleeve or the like is attached thereto. Thus, the optical fiber bundle is formed.

By use of the optical fiber bundle having the optical fiber aligned thus so that the input terminal side areas of the optical fiber are associated with the output terminal side areas thereof, higher-accuracy control becomes easier than that in the case where the light intensity is controlled in the same manner as that described in the first to fifth embodiments.

By use of the optical fiber bundle formed thus, a current to be supplied to the input terminal side can be calculated easily so that a desired output side light intensity distribution can be obtained.

In addition, according to such a method, the output side light intensity distribution can be controlled extremely easily and precisely.

In addition, the light intensity may be controlled to form a ring-like irradiated area with the central portion prevented from shining.

Incidentally, the optical fibers were divided into three groups in the first and second embodiments. However, if the optical fibers are divided into a larger number of groups, the light intensity can be controlled with higher accuracy so that a light intensity distribution having a shape closer to a desired one can be obtained.

In addition, the optical fiber were masked and observed in turn visually on the output terminal side so as to be divided into groups in the embodiments. However, a sensor formeasuring the light intensity, such as an infrared sensor, may be used to measure the light intensity. In this case, realignment can be made by grouping based on whether the light intensity in question is beyond a threshold value or not.

In addition, a plurality of light sources, for example, a first light source and a second light source, may be provided as the optical fiber light source so that the light sources can be changed over. In this case, if the irradiation light wavelength is made adjustable on the output terminal side, a plurality of kinds of desired light sources can be obtained by one optical fiber bundle.

As has been described above, with an optical fiber bundle according to the invention, a desired light distribution can be obtained.

Further, with a light source device according to the invention, a desired light distribution can be obtained.

In addition, with a method for manufacturing an optical fiber bundle according to the invention, it is possible to obtain an optical fiber bundle having a desired light intensity distribution extremely efficiently.

What is claimed is:

1. An optical fiber bundle, comprising:
a plurality of optical fiber light sources;
a plurality of optical fibers bundled on both an input terminal side thereof and an output terminal side thereof,
said optical fibers receiving light from said input terminal side and outputting said light to said output terminal side; and
a connecting member provided for said optical fiber bundle;
wherein
said optical fibers are divided on said input terminal side, individually or into a plurality of groups in accordance with output terminal side positions of said optical fibers,
said optical fiber bundle is arranged to adjust said light received from said input terminal side for each of said optical fibers or for each of said groups and
said optical fiber light sources are provided for each of said optical fibers or each of said groups.

2. The optical fiber bundle according to claim 1, wherein each of said optical fibers includes a connecting member.

3. The optical fiber bundle according to claim 1, wherein said optical fibers are divided into a plurality of groups in accordance with output terminal side positions thereof, and
each of said groups includes a connecting member.

4. The optical fiber bundle according to claim 1, wherein each of said optical fiber or each of said groups includes a light intensity adjusting member.

5. The optical fiber bundle according to claim 1, wherein said optical fibers include an optical fiber for detecting said light on said output terminal side of said optical fiber bundle.

6. A light source device comprising:
an optical fiber light source; and
an optical fiber bundle for receiving light from said optical fiber light source on an input terminal side thereof and outputting said light to an output terminal side thereof,
said optical fiber bundle including a plurality of optical fibers bundled in a desired shape on both said input terminal side thereof and said output terminal side thereof,
wherein
said optical fibers are divided on said input terminal side thereof, individually or into a plurality of groups in accordance with output terminal side positions of said optical fibers, and
said optical fiber bundle is arranged to adjust a light intensity of said light received from said optical fiber light source on said input terminal side for each of said optical fibers or for each of said groups.

7. The light source device according to claim 6, wherein each of said optical fibers includes a connecting member, and is connected to said optical fiber light source through said connecting member.

8. The light source device according to claim 6, wherein said optical fibers are divided into a plurality of groups in accordance with output terminal side positions thereof,
each of said groups includes a connecting member, and is connected to said optical fiber light source through said connecting member.

9. The light source device according to claim 6, wherein said optical fibers are connected to said optical fiber light source through a light intensity adjusting member provided for each of said optical fibers or each of said groups.

10. A method of manufacturing a light source device, comprising the steps of:
bundling a plurality of optical fibers to form an optical fiber bundle;
irradiating a light from an input terminal side of said optical fiber bundle;
detecting a light intensity and light distribution pattern on an output terminal side of said optical fiber bundle;
calculating a light intensity of an optical fiber light source for each of said optical fiber on the basis of a detection result in order to obtain a desired output on said output terminal side; and
connecting said optical fiber light source to said optical fiber bundle on the basis of a calculation result.

11. A method for manufacturing a light source device according to claim 10, further comprising the step of:
adjusting said optical fiber light source to make said light intensity distribution uniform.

* * * * *